United States Patent
Tsai et al.

(10) Patent No.: US 9,799,742 B1
(45) Date of Patent: Oct. 24, 2017

(54) FIELD EFFECT TRANSISTOR HAVING ELECTRODE COATED SEQUENTIALLY BY OXIDE LAYER AND NITRIDE LAYER AND METHOD FOR MANUFACTURING THE SAME

(71) Applicant: TAIWAN SEMICONDUCTOR CO., LTD., New Taipei (TW)

(72) Inventors: Yi-Lung Tsai, New Taipei (TW); Aryadeep Mrinal, New Taipei (TW); Mohammad Amanullah, New Taipei (TW); Po-Wen Yang, New Taipei (TW); Shu-Siang Liang, New Taipei (TW)

(73) Assignee: Taiwan Semiconductor Co., Ltd., New Taipei (TW)

( * ) Notice: Subject to any disclaimer, the term of this patent is extended or adjusted under 35 U.S.C. 154(b) by 0 days.

(21) Appl. No.: 15/356,927

(22) Filed: Nov. 21, 2016

(30) Foreign Application Priority Data

Sep. 26, 2016 (TW) .............................. 105130993 A

(51) Int. Cl.
*H01L 29/788* (2006.01)
*H01L 29/423* (2006.01)
*H01L 29/10* (2006.01)
*H01L 29/66* (2006.01)
*H01L 29/78* (2006.01)

(52) U.S. Cl.
CPC ...... *H01L 29/4236* (2013.01); *H01L 29/1095* (2013.01); *H01L 29/66666* (2013.01); *H01L 29/7827* (2013.01)

(58) Field of Classification Search
CPC ............ H01L 27/115; H01L 27/11521; H01L 27/11568; H01L 21/28282; H01L 29/66833; H01L 29/792
See application file for complete search history.

(56) References Cited

U.S. PATENT DOCUMENTS 6,147,377 A * 11/2000 Liu ................... H01L 21/28273
257/314
7,535,048 B2 * 5/2009 Prall ................... G11C 11/5692
257/310

(Continued)

*Primary Examiner* — Jaehwan Oh
(74) *Attorney, Agent, or Firm* — Muncy, Geissler, Olds & Lowe, P.C.

(57) ABSTRACT

A field effect transistor includes a substrate, an epitaxial layer, a remnant-oxide layer, an electrode, a surrounding-oxide layer, a surrounding-nitride layer, a gate oxide layer, a gate, a P-body region, a source region, an interlayer dielectric and a source electrode. The epitaxial layer on the substrate has a trench having a sidewall and a bottom. The electrode inside the trench is coated subsequently by the surrounding-oxide layer, the surrounding-nitride layer and the remnant-oxide layer. The gate formed on the gate oxide layer is separated from the electrode sequentially by the gate oxide layer, the surrounding-nitride layer and the surrounding-oxide layer. The P-body region and the source region, formed at the epitaxial layer, are separated from the gate by the gate oxide layer. The interlayer dielectric covers the source region and the gate. The source electrode covers the P-body region and the interlayer dielectric, and contacts the source region.

5 Claims, 20 Drawing Sheets

(56) References Cited

U.S. PATENT DOCUMENTS

| | | | |
|---|---|---|---|
| 2003/0075756 A1* | 4/2003 | Suzuki | H01L 21/28273 257/315 |
| 2006/0240619 A1* | 10/2006 | Ozawa | H01L 27/11521 438/257 |
| 2007/0105308 A1* | 5/2007 | Hosaka | H01L 27/115 438/257 |
| 2009/0289294 A1* | 11/2009 | Izumi | H01L 27/11519 257/316 |

* cited by examiner

FIELD EFFECT TRANSISTOR HAVING ELECTRODE COATED SEQUENTIALLY BY OXIDE LAYER AND NITRIDE LAYER AND METHOD FOR MANUFACTURING THE SAME

BACKGROUND OF INVENTION

1. Field of the Invention

The invention relates to a field effect transistor having an electrode coated sequentially by an oxide layer and a nitride layer and a method for manufacturing the same, and more particularly to the field effect transistor and the method for manufacturing this field effect transistor that introduce at least a surrounding-oxide layer and a surrounding-nitride layer to sequentially coat an electrode.

2. Description of the Prior Art

With booming progress in semiconductor technology, various advanced manufacturing processes have been introducing to produce the field effect transistors, especially the metal-oxide-semiconductor field effect transistors (MOSFET).

Referring now to FIG. 1, a schematic cross-sectional view of a typical field effect transistor produced by a conventional manufacturing process in the prior art is shown. This conventional field effect transistor PA1 is structured by forming an electrode PA12 and a gate PA13 inside a trench PA11; in which the electrode PA12 and the gate PA13 are isolated from each other, and the gate PA13 is generally formed as a dimple structure PA131.

Nevertheless, subject to some limitations in the existing manufacturing processes, current MOSFETs generally have common shortcomings in the high total gate charge (Qg) and the high figure of merit (FOM). In addition, the existence of the dimple structure PA131 further makes worse the aforesaid shortcomings.

The aforesaid total gate charge stands for the charge required for the gate to put the MOSFET in a complete conductive state. The total gate charge and the start-up speed of MOSFET are highly related. A high total gate charge would reduce the switching speed, but increase the gate loss; such that the switching loss would be increased, but the efficiency is reduced. In addition, the FOM is determined by the on-state resistance (Rdson) and the total gate charge (Qg); in particular, by the value of Qg×Rdson. A high FOM implies poor performance in the conductive loss and the switching loss.

Hence, while in forming the trench of the MOSFET, the topic of reducing the total gate charge and the FOM by improving the dimple structure is crucial to the art.

SUMMARY OF THE INVENTION

In viewing of the aforesaid common shortcomings of higher total gate charge and higher FOM in the current MOSFET structures produced by the conventional manufacturing processes, accordingly, it is the primary object of the present invention to provide a field effect transistor having an electrode coated sequentially by an oxide layer and a nitride layer and a method for manufacturing the same, which introduce at least a surrounding-oxide layer and a surrounding-nitride layer to sequentially coat an electrode so as to reduce the total gate charge and the FOM of the field.

In the present invention, the method for manufacturing a field effect transistor having an electrode coated sequentially by an oxide layer and a nitride layer includes: a step (a) of providing a semiconductor substrate, and then forming an epitaxial layer over the semiconductor substrate; a step (b) of etching the epitaxial layer to form a trench extending in a vertical direction, the trench having a sidewall and a bottom; a step (c) of forming a first oxide layer over the epitaxial layer, the sidewall and the bottom, and then forming a first nitride layer over the first oxide layer; a step (d) of forming a second oxide layer over the first nitride layer, and then forming a first poly silicon layer over the second oxide layer; a step (e) of removing part of the first poly silicon layer by etching, and defining the rest of the first poly silicon layer inside the trench as an electrode; a step (f) of forming a third oxide layer over the electrode and the second oxide layer; a step (g) of removing part of the second oxide layer and the third oxide layer by etching, and defining the rest of the second oxide layer and the third oxide layer as a surrounding-oxide layer completely coating the electrode; a step (h) of forming a second nitride layer over the surrounding-oxide layer and the first nitride layer; a step (i) of removing part of the first nitride layer and the second nitride layer by etching, and defining the rest of the first nitride layer and the second nitride layer inside the trench as a surrounding-nitride layer completely coating the surrounding-oxide layer; a step (j) of removing part of the first oxide layer by etching, and defining the rest of the first oxide layer inside the trench as a remnant-oxide layer; a step (k) of forming a gate oxide layer over the sidewall, the surrounding-nitride layer and the remnant-oxide layer, and forming a gate on the gate oxide layer, the gate being separated from the electrode sequentially by the gate oxide layer, the surrounding-nitride layer and the surrounding-oxide layer; a step (l) of forming sequentially a P-body region and a source region at the epitaxial layer by being close to the gate; a step (m) of forming an interlayer dielectric to cover the source region and the gate; and, finally, a step (n) of forming a source electrode to cover the P-body region and the interlayer dielectric and to contact the source region, such that the field effect transistor having the electrode coated sequentially by the oxide layer and the nitride layer is produced.

In one embodiment of the present invention, in the step (c), the first oxide layer includes a first oxide and a second oxide, the first oxide being formed over the epitaxial layer, the sidewall and the bottom, the second oxide being formed over the first oxide; in the step (j), the remnant-oxide layer has a concave surface connecting the sidewall and an upper portion of the surrounding-nitride layer; in the step (k), the gate oxide layer fills the concave surface; and, the step (k) further includes a step (k0) of forming a second poly silicon layer over the gate oxide layer, removing part of the second poly silicon layer by etching, and defining the rest of the second poly silicon layer inside the trench as the gate.

In another aspect of the present invention, the field effect transistor having an electrode coated sequentially by an oxide layer and a nitride layer includes: a semiconductor substrate, an epitaxial layer, a remnant-oxide layer, an electrode, a surrounding-oxide layer, a surrounding-nitride layer, a gate oxide layer, a gate, a P-body region, a source region, an interlayer dielectric and a source electrode. The epitaxial layer formed over the semiconductor substrate has at least one trench extending in a vertical direction. The trench has a sidewall and a bottom. The remnant-oxide layer is formed over the sidewall and the bottom. The electrode is formed inside the trench. The surrounding-oxide layer is formed inside the trench to completely coat the electrode. The surrounding-nitride layer is formed inside the trench to completely coat the surrounding-oxide layer, and is partly coated by the remnant-oxide layer. The gate oxide layer is formed over the sidewall, the surrounding-nitride layer and the remnant-oxide layer. The gate formed on the gate oxide layer is separated from the electrode sequentially by the gate oxide layer, the surrounding-nitride layer and the surrounding-oxide layer. The P-body region formed at the epitaxial layer is separated from the gate by the gate oxide layer. The source region formed on the P-body region is separated from the gate by the gate oxide layer. The interlayer dielectric covers the source region and the gate. The source electrode covers the P-body region and the interlayer dielectric, and contacts the source region.

In one embodiment of the present invention, the remnant-oxide layer further has a concave surface connecting the sidewall and an upper portion of the surrounding-nitride layer, and the gate oxide layer fills the concave surface.

By providing the field effect transistor having an electrode coated sequentially by an oxide layer and a nitride layer and the method for manufacturing the same in accordance with the present invention, since the remnant-oxide layer partly is applied to coat the surrounding-nitride layer, the surrounding-nitride layer is applied to coat the surrounding-oxide layer, and the surrounding-oxide layer is further applied to coat the electrode, then an ONO (Oxide nitride oxide) structure is formed, and thus the gate oxide layer fills the concave surface, thus the total gate charge and the FOM can be effectively reduced.

In addition, by providing the field effect transistor having an electrode coated sequentially by an oxide layer and a nitride layer and the method for manufacturing the same in accordance with the present invention, since the gate oxide layer fills the concave surface, thus the total gate charge and the FOM caused by the dimple structure can be further reduced.

All these objects are achieved by the field effect transistor having an electrode coated sequentially by an oxide layer and a nitride layer and the method for manufacturing the same described below.

BRIEF DESCRIPTION OF THE DRAWINGS

The present invention will now be specified with reference to its preferred embodiment illustrated in the drawings, in which.

DESCRIPTION OF THE PREFERRED EMBODIMENT

The invention disclosed herein is directed to a field effect transistor having an electrode coated sequentially by an oxide layer and a nitride layer and a method for manufacturing the same. In the following description, numerous details are set forth in order to provide a thorough understanding of the present invention. It will be appreciated by one skilled in the art that variations of these specific details are possible while still achieving the results of the present invention. In other instance, well-known components are not described in detail in order not to unnecessarily obscure the present invention.

Figure 1:
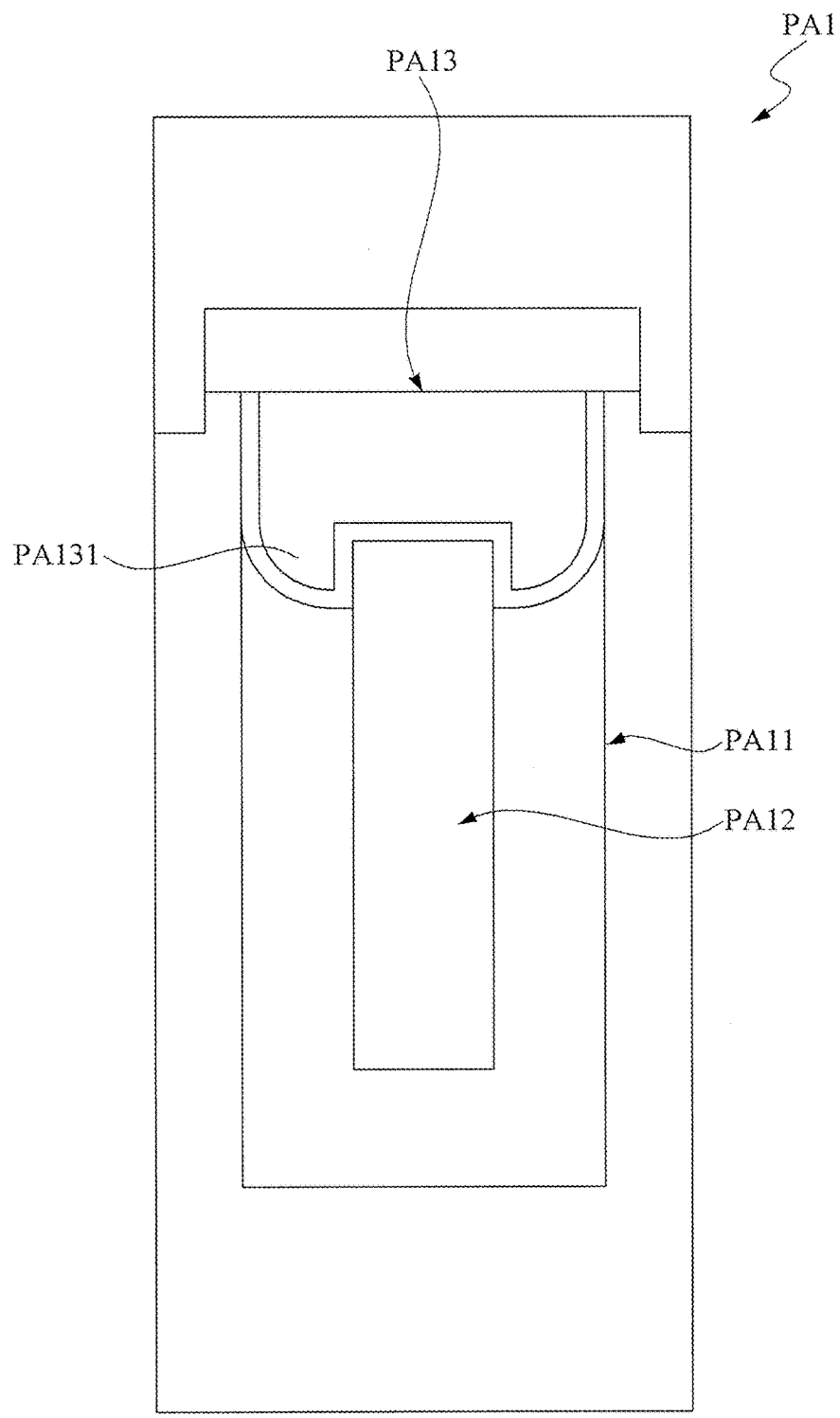
FIG. 1 is a schematic cross-sectional view of a typical field effect transistor produced by a conventional manufacturing process in the prior art.
Figure 2:
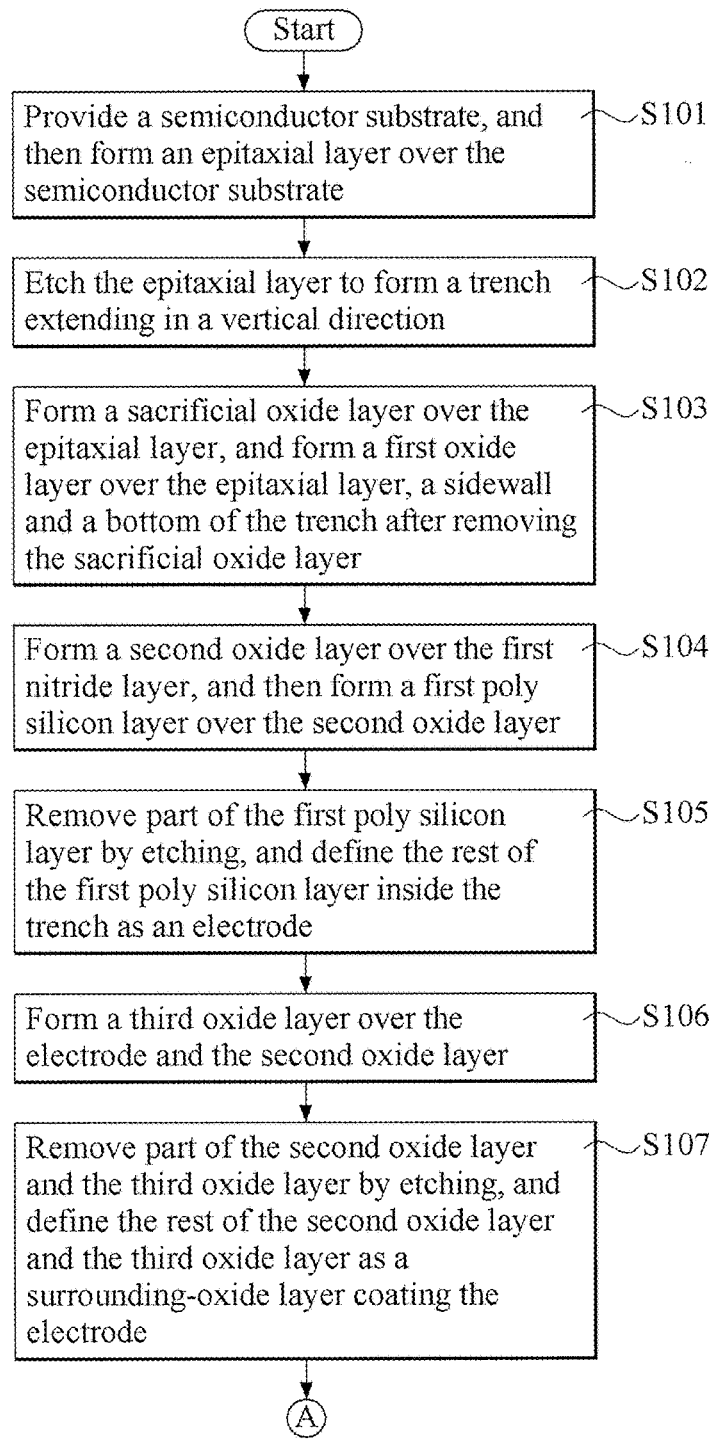
FIG. 2 and FIG. 2A show integrally a flowchart of a preferred embodiment of the method for manufacturing a field effect transistor having an electrode coated sequentially by an oxide layer and a nitride layer in accordance with the present invention.
Figure 2A:
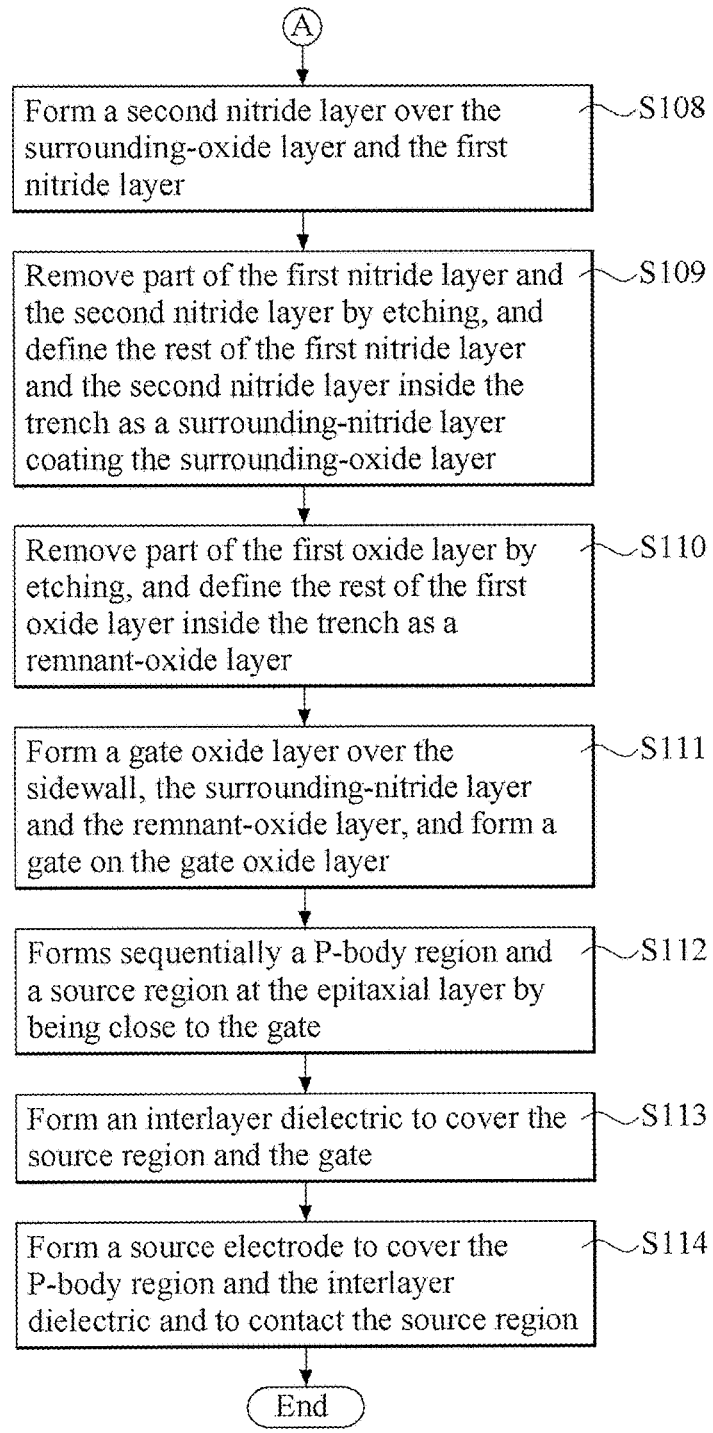
Figure 3:
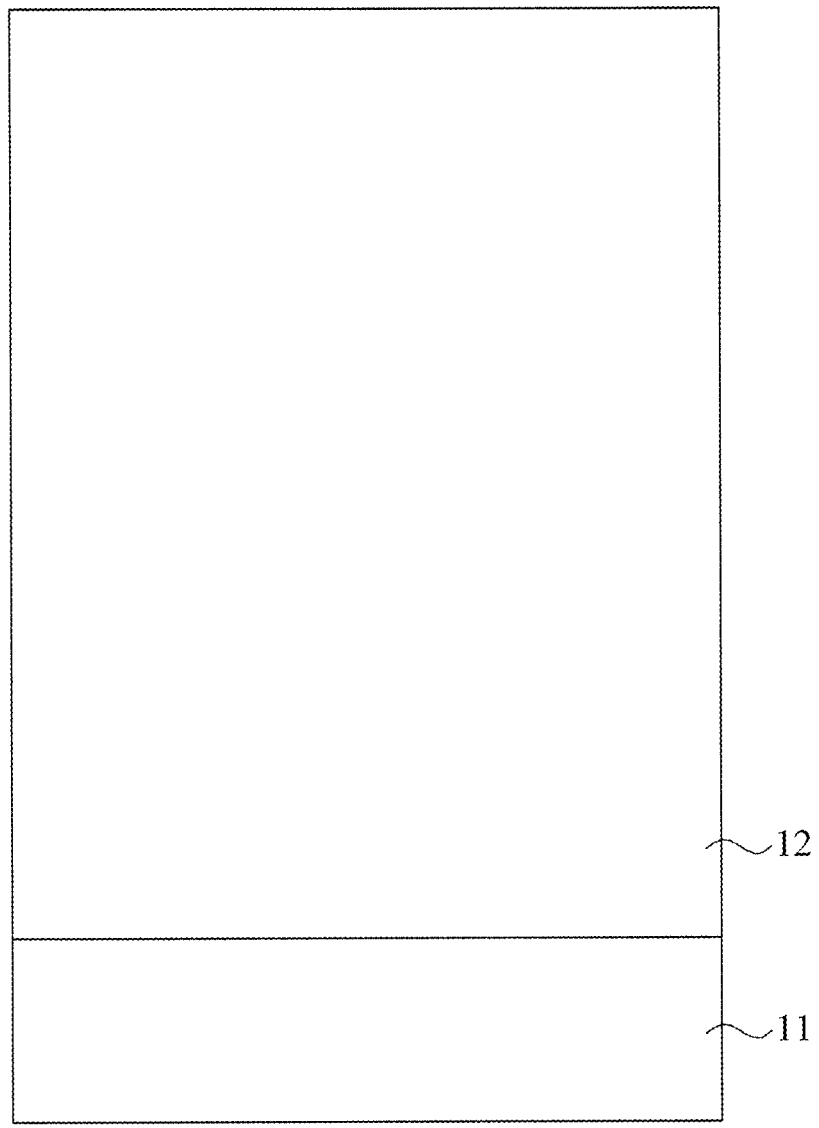
FIG. 3 is a schematic cross-sectional view of a semiconductor substrate and an epitaxial layer of a preferred embodiment of the field effect transistor in accordance with the present invention.
Figure 4:
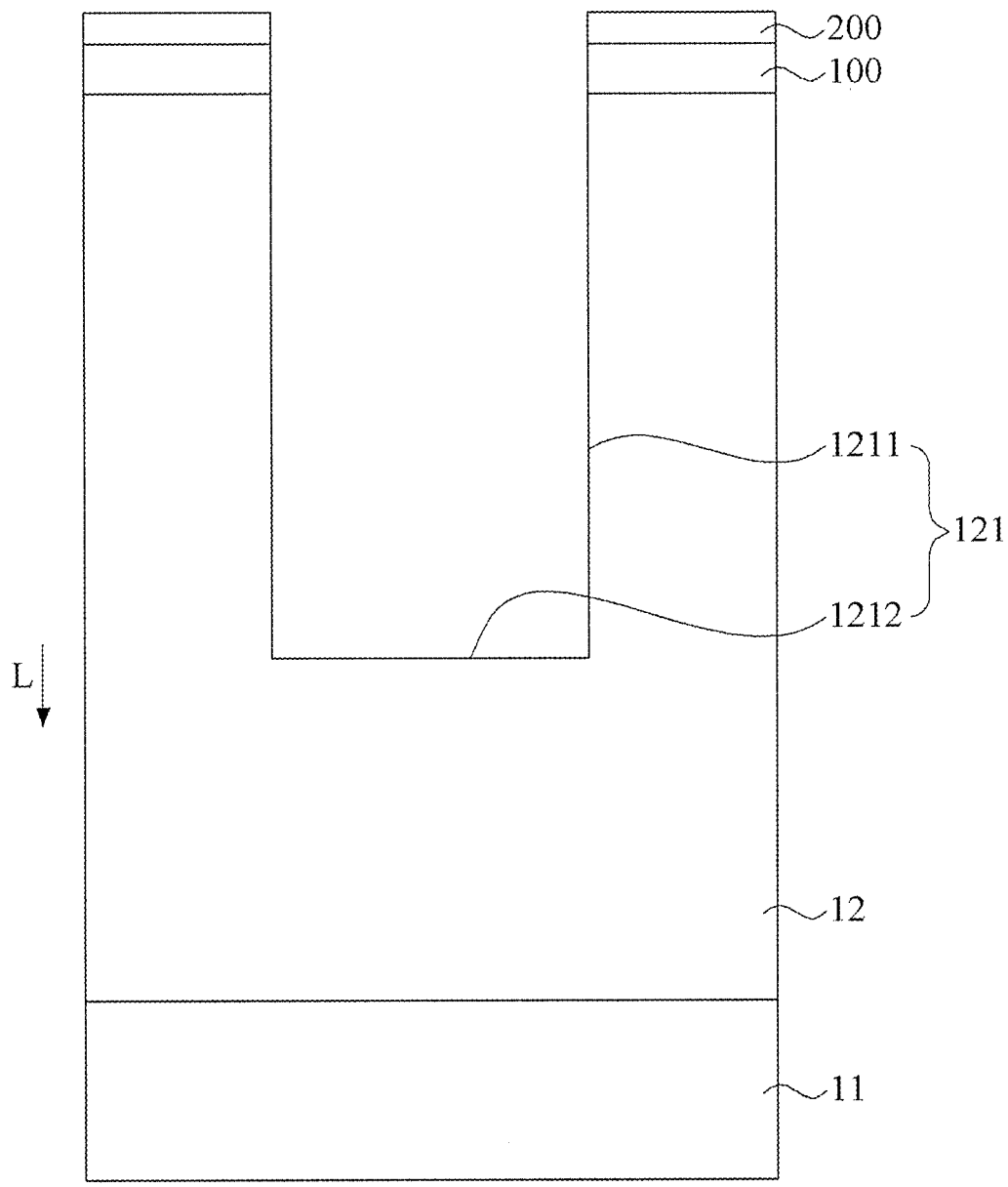
FIG. 4 is a schematic cross-sectional view of a trench formed from etching the epitaxial layer of FIG. 3.
Figure 5:
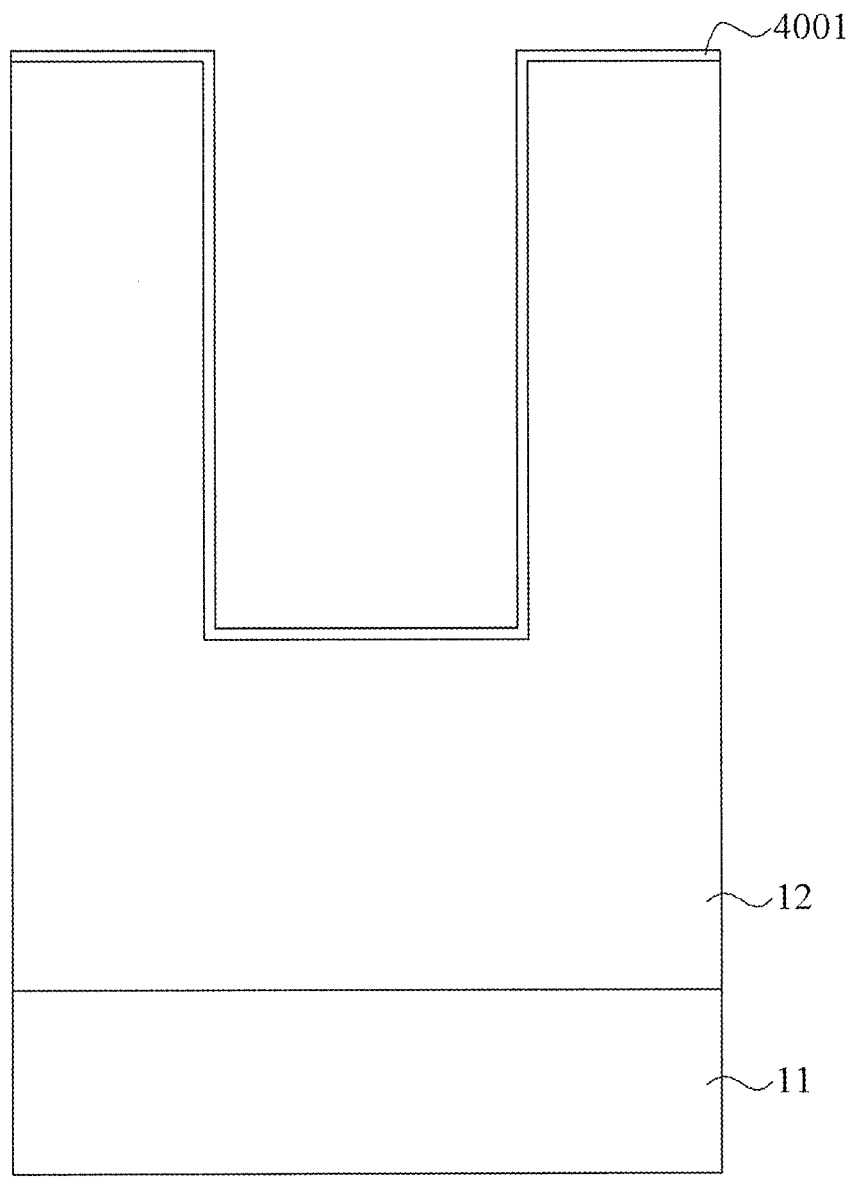
FIG. 5 is a schematic cross-sectional view of a sacrificial oxide layer formed over the trench of FIG. 4.
Figure 6:
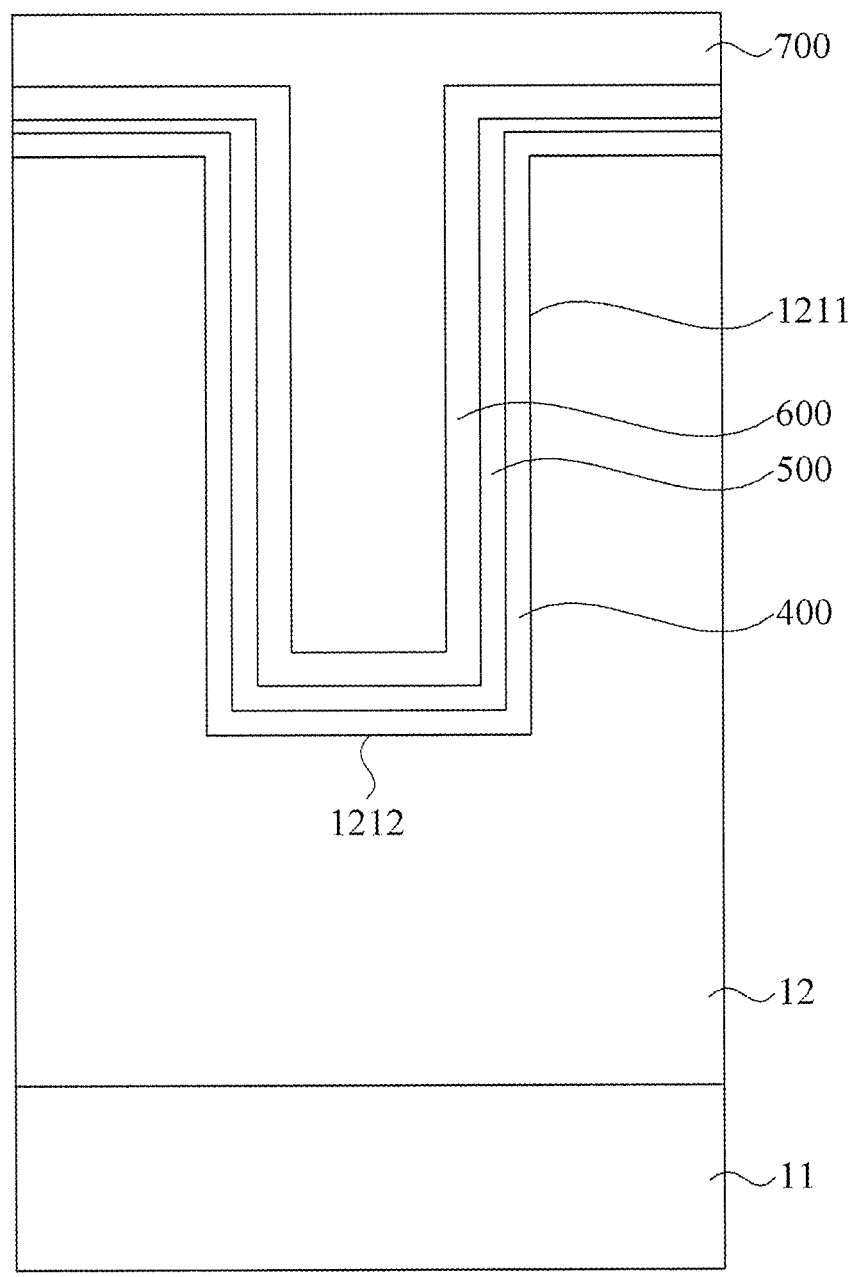
FIG. 6 is a schematic cross-sectional view of a first oxide layer, a first nitride layer, a second oxide layer and a first poly silicon layer formed over the trench of FIG. 4.
Figure 7:
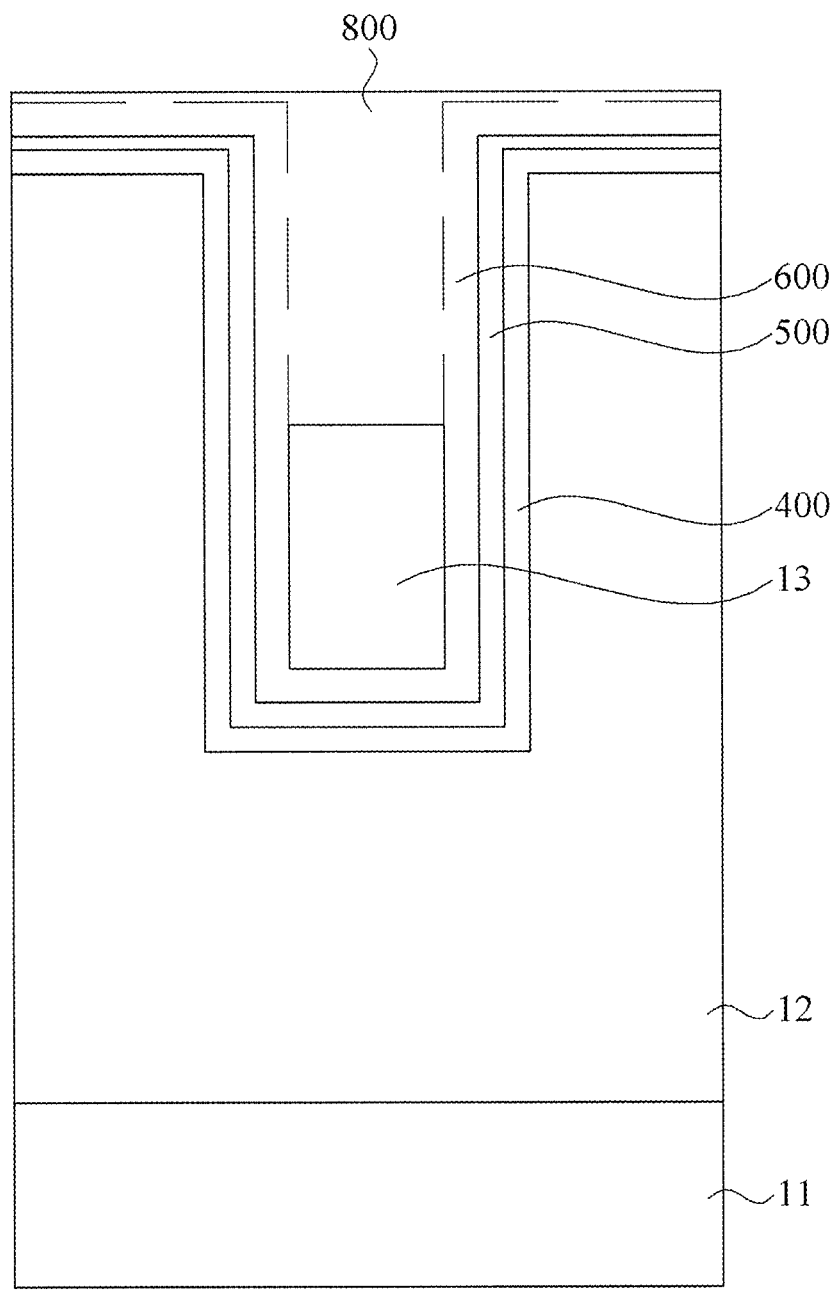
FIG. 7 is a schematic cross-sectional view of a third oxide layer and an electrode formed over the second oxide layer of FIG. 6.
Figure 8:
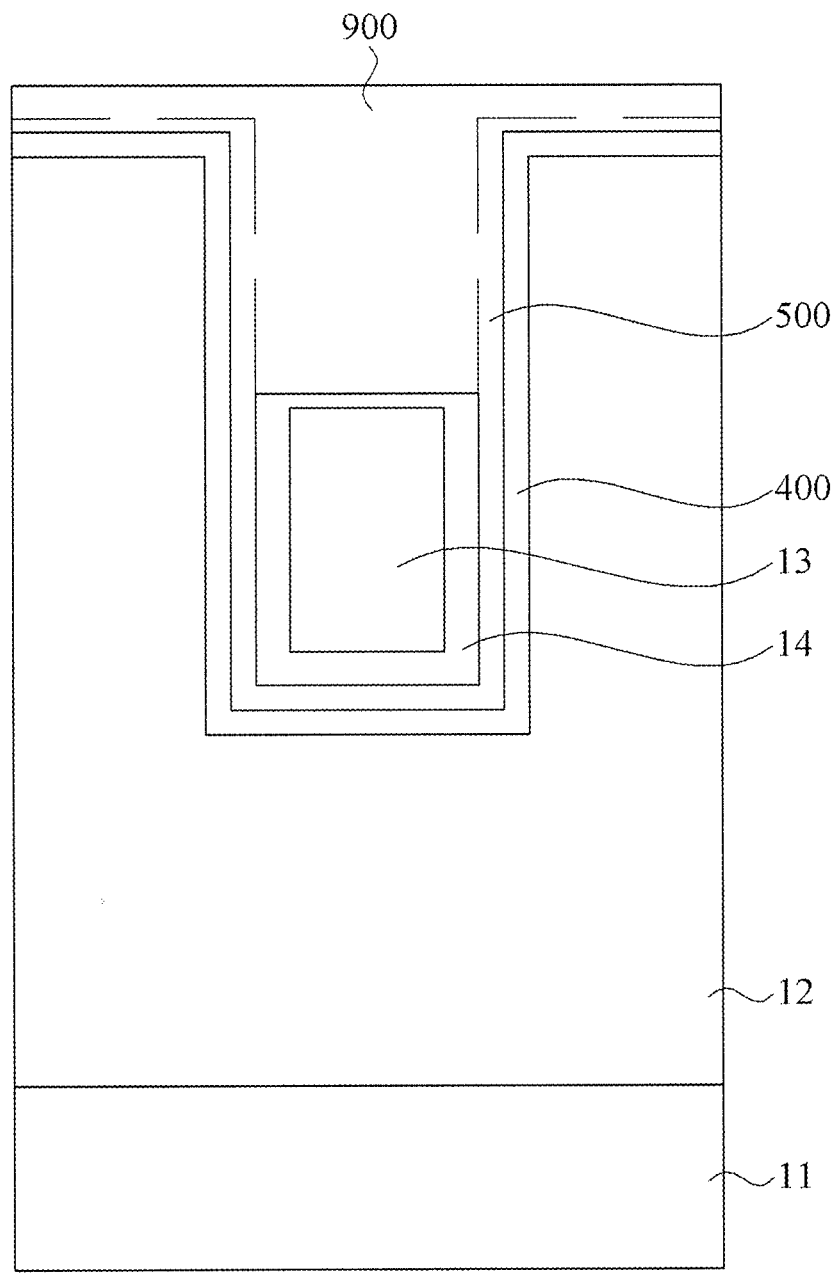
FIG. 8 is a schematic cross-sectional view of a surrounding-oxide layer surrounding the electrode and a second nitride layer formed over the surrounding-oxide layer and the first nitride layer of FIG. 7.
Figure 9:
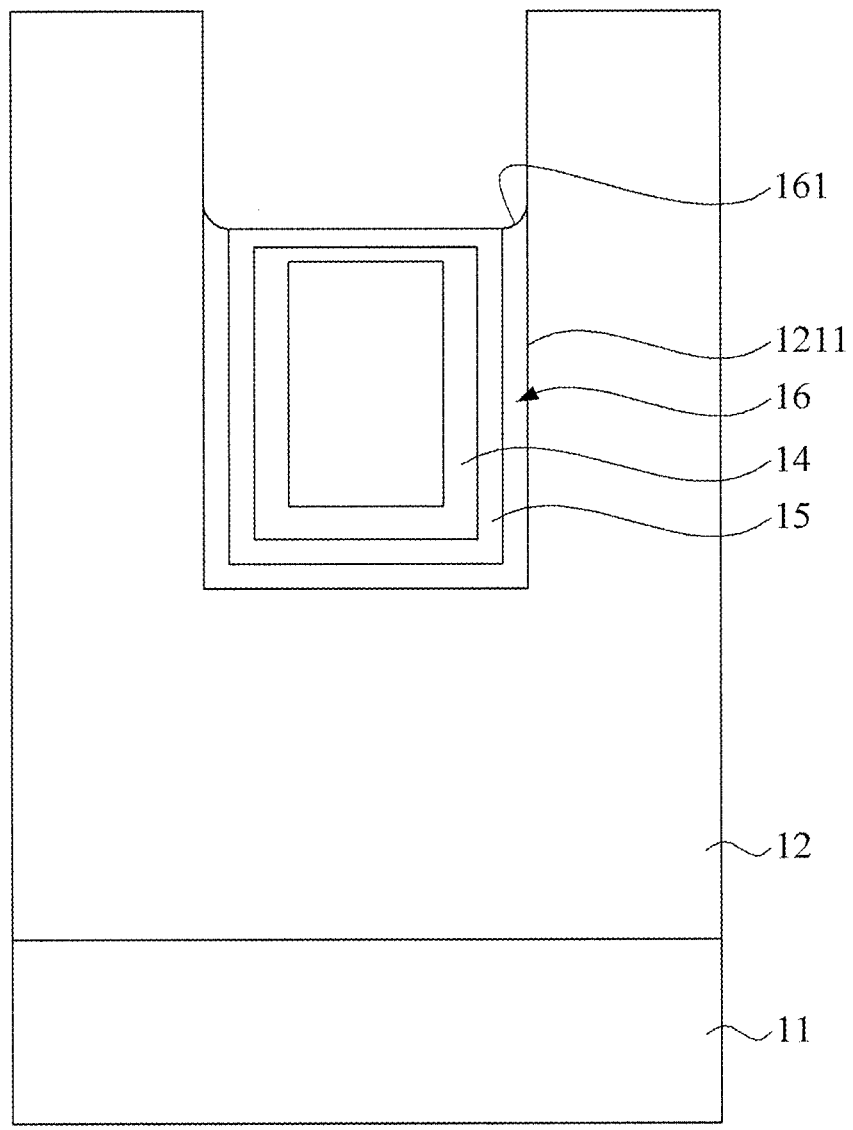
FIG. 9 is a schematic cross-sectional view after a further etching upon the structure of FIG. 8.
Figure 10:
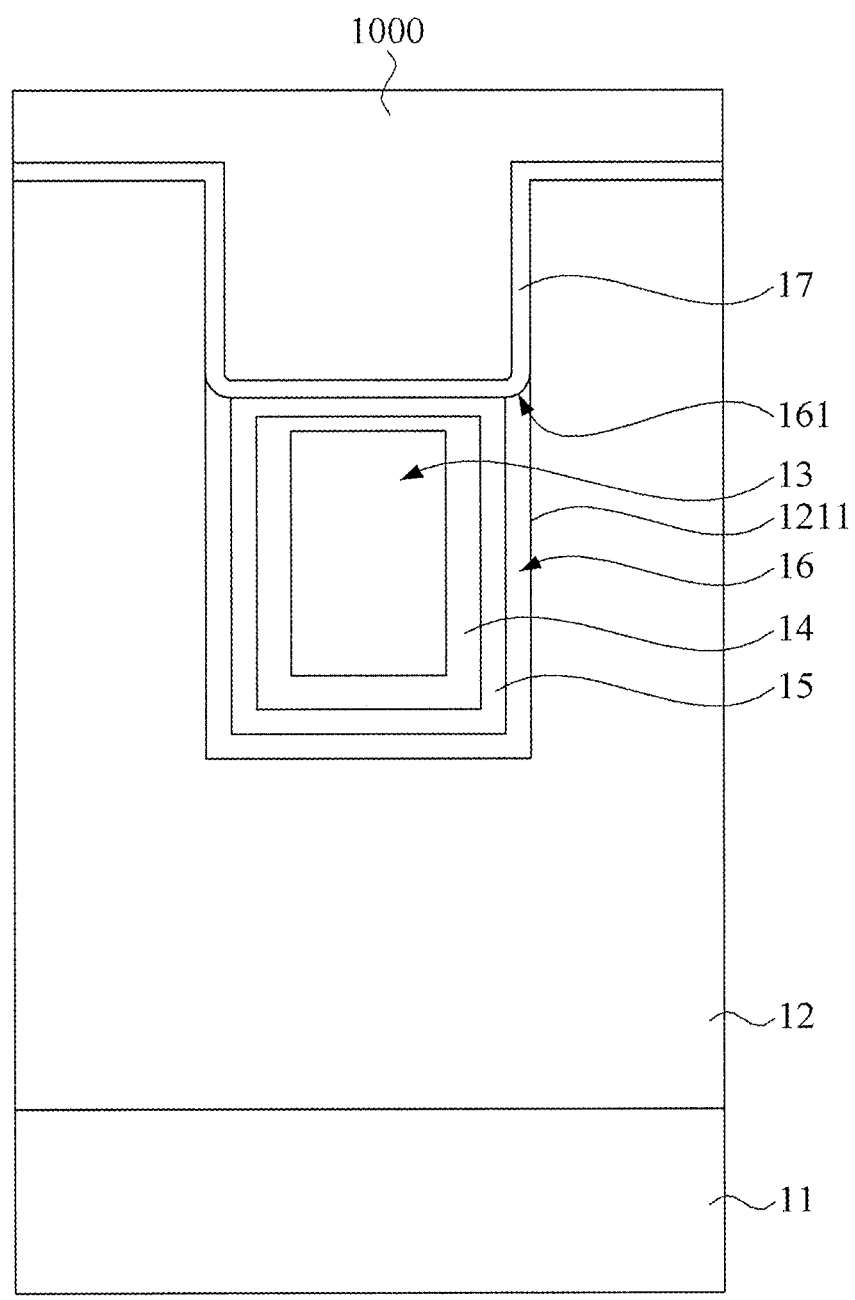
FIG. 10 is a schematic cross-sectional view of a gate oxide layer and a second poly silicon layer formed over the structure of FIG. 9.
Figure 11:
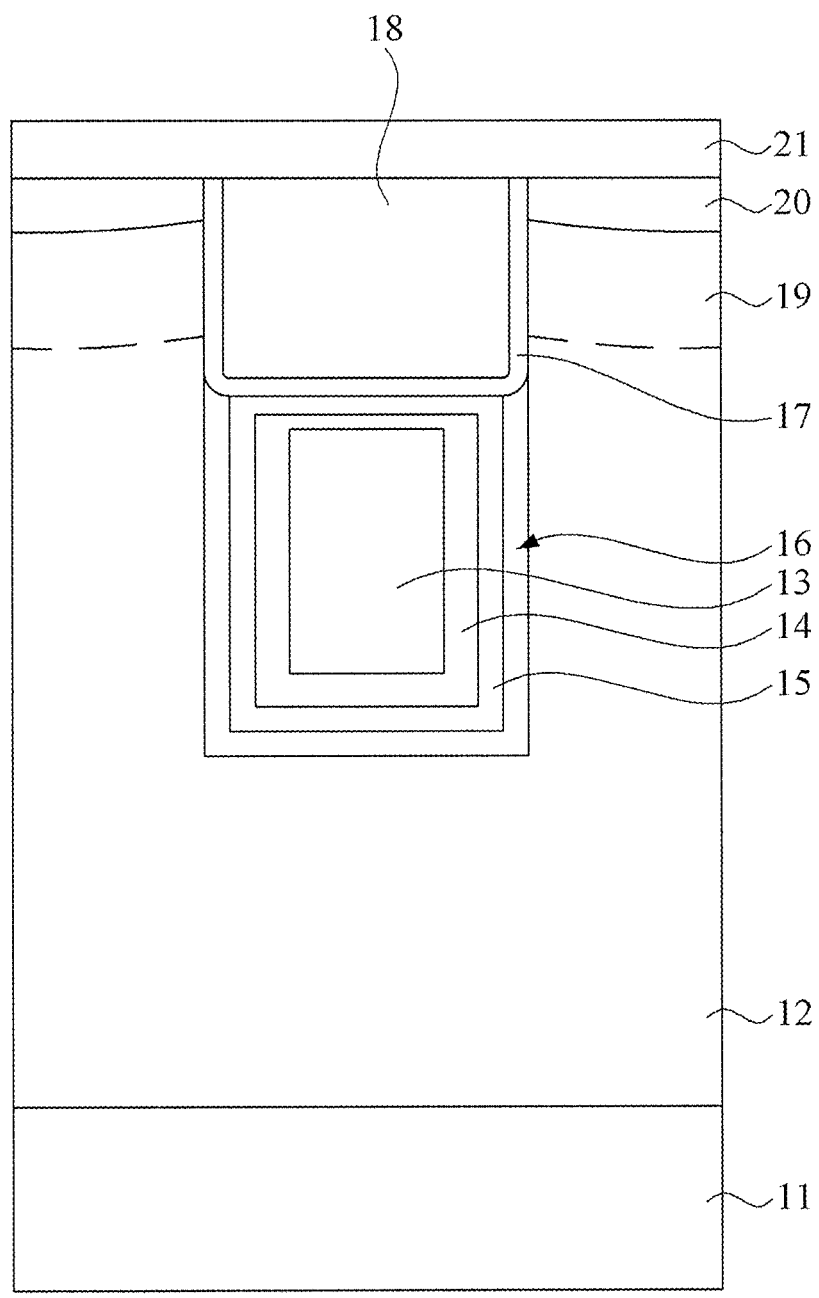
FIG. 11 is a schematic cross-sectional view of a gate, a source region, a P-body region and an interlayer dielectric formed over the structure of FIG. 9.
Figure 12:
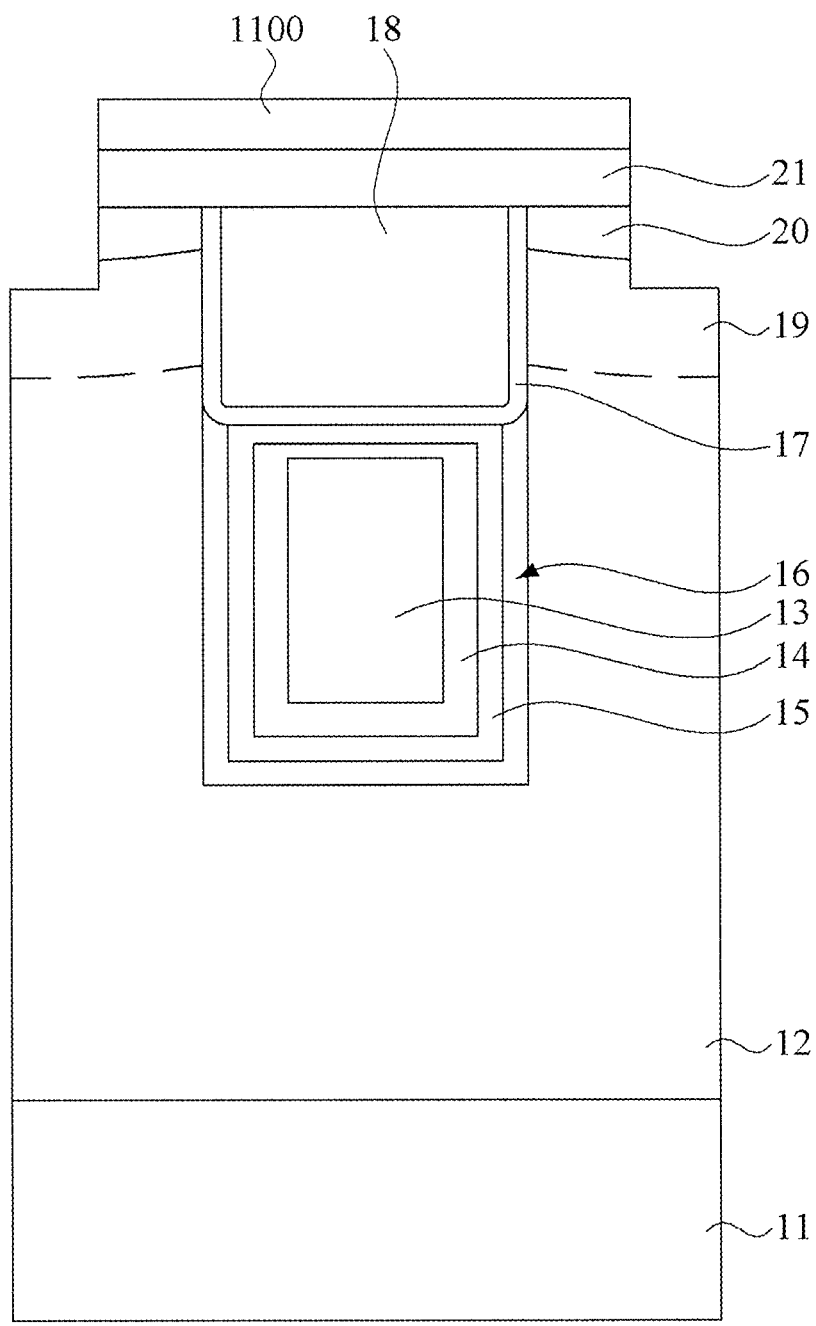
FIG. 12 is a schematic cross-sectional view of an additional mask layer and an etched structure from FIG. 11.
Figure 13:
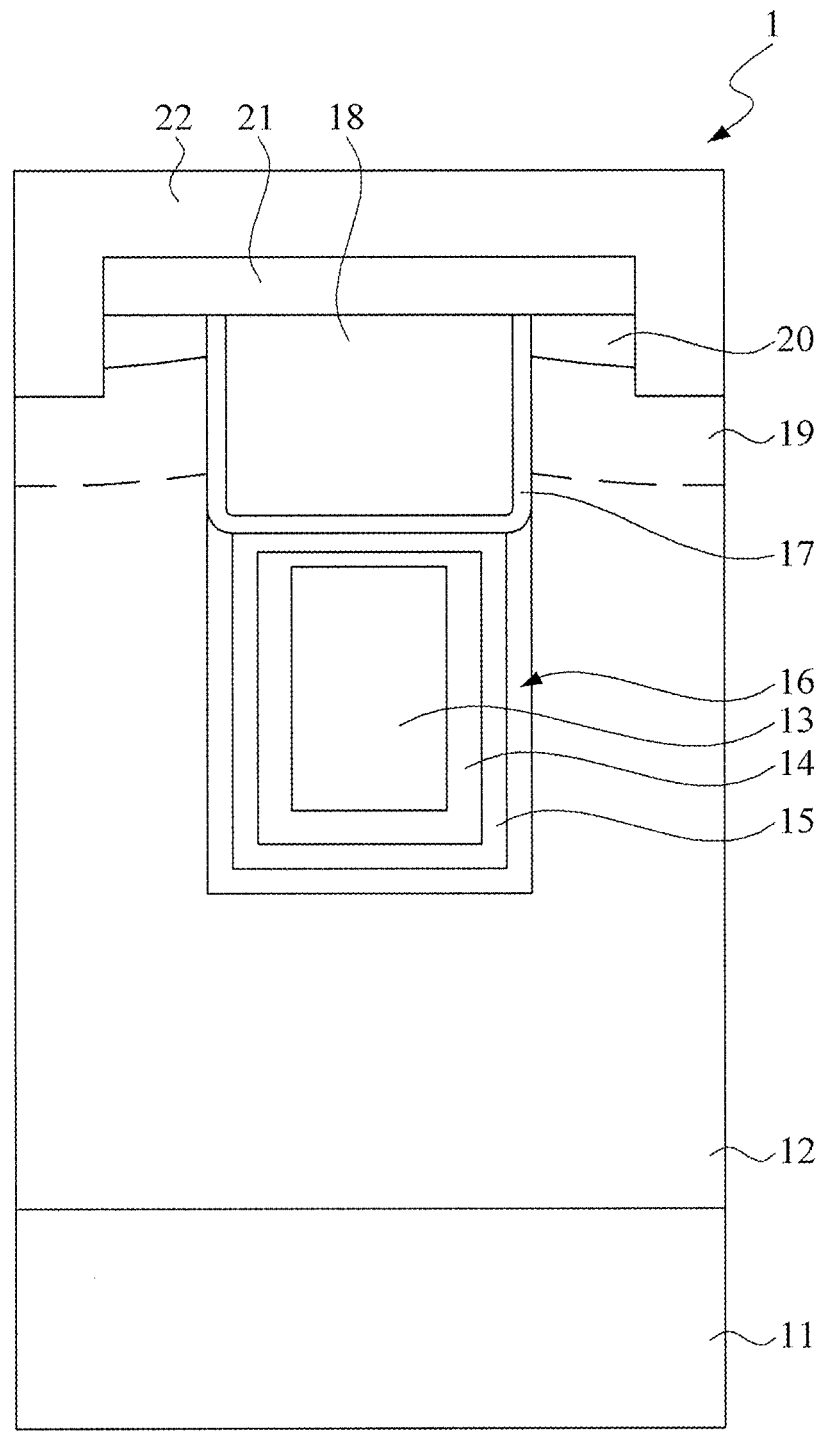
FIG. 13 is a schematic cross-sectional view of the preferred field effect transistor having an electrode coated sequentially by an oxide layer and a nitride layer in accordance with the present invention.

Refer to FIG. 2 to FIG. 13; where FIG. 2 and FIG. 2A show integrally a flowchart of a preferred embodiment of the method for manufacturing a field effect transistor having an electrode coated sequentially by an oxide layer and a nitride layer in accordance with the present invention, FIG. 3 is a schematic cross-sectional view of a semiconductor substrate and an epitaxial layer of a preferred embodiment of the field effect transistor in accordance with the present invention, FIG. 4 is a schematic cross-sectional view of a trench formed from etching the epitaxial layer of FIG. 3, FIG. 5 is a schematic cross-sectional view of a sacrificial oxide layer formed over the trench of FIG. 4, FIG. 6 is a schematic cross-sectional view of a first oxide layer, a first nitride layer, a second oxide layer and a first poly silicon layer formed over the trench of FIG. 4, FIG. 7 is a schematic cross-sectional view of a third oxide layer and an electrode formed over the second oxide layer of FIG. 6, FIG. 8 is a schematic cross-sectional view of a surrounding-oxide layer surrounding the electrode and a second nitride layer formed over the surrounding-oxide layer and the first nitride layer of FIG. 7, FIG. 9 is a schematic cross-sectional view after a further etching upon the structure of FIG. 8, FIG. 10 is a schematic cross-sectional view of a gate oxide layer and a second poly silicon layer formed over the structure of FIG. 9, FIG. 11 is a schematic cross-sectional view of a gate, a source region, a P-body region and an interlayer dielectric formed over the structure of FIG. 9, FIG. 12 is a schematic cross-sectional view of an additional mask layer and an etched structure from FIG. 11, and FIG. 13 is a schematic cross-sectional view of the preferred field effect transistor having an electrode coated sequentially by an oxide layer and a nitride layer in accordance with the present invention.

As shown in FIG. 13, a preferred embodiment of the field effect transistor having an electrode coated sequentially by an oxide layer and a nitride layer in accordance with the present invention produced by the method of the present invention (see FIG. 2 and FIG. 2A for a flowchart) is shown by a schematic cross-sectional view. Details for manufacturing the field effect transistor of the present invention would be demonstrated by figures from FIG. 3 to FIG. 12, and the correspondence step numbers of the method are referred to FIG. 2 and FIG. 2A. As shown in FIG. 3, in Step S101, a semiconductor substrate 11 and an epitaxial layer 12 formed on the semiconductor substrate 11 are provided. Since various processed in the art can be applied to prepare this semiconductor substrate 11 and this epitaxial layer 12, thus details thereabout would be omitted herein. Generally, the semiconductor substrate 11 is usually doped with impurities (i.e. dopants) so as to have a specific ion concentration (forming an N-type semiconductor for example), and the epitaxial layer 12 is also doped with impurities so as to have another specific ion concentration (forming another N-type semiconductor for example). In particular, the ion concentration of the epitaxial layer 12 is smaller than that of the semiconductor substrate 11. However, the doping technology in the semiconductor industry is already mature in the art, and thus details thereabout would be omitted herein.

After finishing Step S101, Step S102 is performed to form at least one trench 121 (one shown in the figure) extending in a vertical direction L by etching the epitaxial layer 12, as shown in FIG. 4. The trench 121 has at least one sidewall 1211 (two sidewalls in the figure) and a bottom 1212. In this etching process, by referring to FIG. 4, a hard mask 100 is firstly formed over the epitaxial layer 12, a photo resist layer 200 is further formed over the hard mask 100, and then the trench 121 is formed by etching the photo resist layer 200, the hard mask 100 and the epitaxial layer 12. In addition, to make concise the following description, the tem' "sidewall" of the trench stands for all the sidewalls 1211 of the trench 121 shown in the figure. That is to say that the following "sidewall" in the description treats the two sidewalls 1211 shown in FIG. 4 as an integral sidewall.

As shown in FIG. 5 and FIG. 6, after the photo resist layer 200 and the hard mask 100 is removed from the epitaxial layer 12, Step S103 is performed over the epitaxial layer 12 as well as the trench 121 to firstly form a first oxide layer 400 to coat the sidewall 1211 of the trench 121, the bottom 1212 of the trench 121 and the top of the epitaxial layer 12. Then, a first nitride layer 500 is formed over the first oxide layer 400. In the present invention, materials for the first oxide layer 400 and the first nitride layer 500 are well known in the art, and thus details thereabout would be omitted herein.

In practice, to perform Step S103, a sacrificial oxide layer 4001 needs to be formed over the epitaxial layer 12 in advance, as shown in FIG. 5. Then, a first oxide layer 400 is formed over the exposed surface of the epitaxial layer 12 after removing the sacrificial oxide layer 4001 and thereafter growing the first oxide layer 400, in which the aforesaid exposed surface of the epitaxial layer 12 includes the top surface of the epitaxial layer 12, the sidewall 1211 of the trench 121 and the bottom 1212 of the trench 121.

Referred also to FIG. 6, in performing Step S104, a second oxide layer 600 is formed over the first nitride layer 500, and a T-shape first poly silicon layer 700 is then formed over the second oxide layer 600 by filling the trench 121. In practice, materials for the second oxide layer 600 and the first poly silicon layer 700 are well known to the art, and thus details thereabout would be omitted herein.

As shown in FIG. 7, in performing Step S105, part (the upper portion shown in the figure) of the first poly silicon layer 700 is removed by etching, and the remaining first poly silicon layer 700 inside the trench 121 is thus defined as an electrode 13. Then, in performing Step S106, a third oxide layer 800 (as a T-shape layer filling the trench 121 shown in the figure) is formed over the electrode 13 and the second oxide layer 600. Similarly, the material for third oxide layer 800 is well known to the art, and thus details thereabout would be omitted herein.

As shown in FIG. 7, in performing Step S107, part (the upper portion shown in the figure) of the second oxide layer 600 and the third oxide layer 800 is removed by etching, and the remaining second oxide layer 600 and the remaining third oxide layer 800 are integrally defined as a surrounding-oxide layer 14 to coat the electrode 13 completely by circling. Then, in performing Step S108, a second nitride layer 900 (as a T-shape layer filling the trench 121 shown in the figure) is formed over the surrounding-oxide layer 14 and the first nitride layer 500. Also, the material for the second nitride layer 900 is well known to the art, and thus details thereabout would be omitted herein.

As shown in FIG. 9, in performing Step S109, part (the upper portion shown in the figure) of the first nitride layer 500 and the second nitride layer 900 is removed by etching, and the remaining first nitride layer 500 and the remaining second nitride layer 900 are integrally defined as a surrounding-nitride layer 15 to coat the surrounding-oxide layer 14 completely by circling. Then, in performing Step S110, part (the upper portion shown in the figure) of the first oxide layer 400 is further removed by etching, and the remaining first oxide layer 400 is thus defined as a remnant-oxide layer 16 inside the trench 121. As shown in FIG. 9, each of both exposed ends of the remnant-oxide layer 16 is shaped, but not limited, to have a concave surface 161 connecting the sidewall 1211 of the trench 121 and an upper portion of the surrounding-nitride layer 15.

Referring to FIG. 10 and FIG. 11, in performing Step S111, a gate oxide layer 17 is formed over the sidewall 1211 of the trench 121, the surrounding-nitride layer 15 and the remnant-oxide layer 16, and a gate 18 is formed inside the trench 121. The gate 18 is separated from the electrode 13 sequentially by the gate oxide layer 17, the surrounding-nitride layer 15 and the surrounding-oxide layer 14, in which the gate oxide layer 17 thoroughly contacts the concave surfaces 161.

In details, while in forming the gate 18, a T-shaped second poly silicon layer 1000 is firstly formed over the gate oxide layer 17 by filling the trench 121. Then, part (the upper portion shown in the figure) of the second poly silicon layer 1000 is removed by etching, and the remaining second poly silicon layer 1000 inside the trench 121 is thus defined as the gate 18, in which the gate 18 is contained by the remaining gate oxide layer 17.

As shown in FIG. 11, in performing Step S112, a P-body region 19 and a source region (N+) 20 are subsequently formed at the epitaxial layer 12 by being close to the gate 18, in which the gate 18 is separated from both the P-body region 19 and the source region 20 by the gate oxide layer 17. Then, in performing Step S113, an interlayer dielectric (ILD) 21 is formed to cover the source region 20 and the gate 18.

Referring now to FIG. 12, a mask layer 1100 is formed over the interlayer dielectric 21, and part of the P-body region 19, the source region 20, the interlayer dielectric 21 and the mask layer 1100 is removed by etching. Then, the remaining mask layer 1100 is removed.

Referring now to FIG. 13, finally in performing Step S114, a source electrode 22 is formed to cover the P-body region 19, the source region 20 and the interlayer dielectric 21 so as to complete the production of the field effect transistor having an electrode coated sequentially by an oxide layer and a nitride layer 1 of the present invention. In particular, the source electrode 22 is formed as an inverse u-shaped structure.

Namely, in the preferred embodiment of the field effect transistor having an electrode coated sequentially by an oxide layer and a nitride layer 1 in accordance with the present invention, the epitaxial layer 12 is formed on the semiconductor substrate 11, the remnant-oxide layer 16 is formed on the sidewall 1211 and bottom 1212 of the trench 121, and the electrode 13 coated by the surrounding-oxide layer 14 and further by the surrounding-nitride layer 15 is formed inside the trench 121. Also, the remnant-oxide layer 16 contains the electrode 13 coated by the surrounding-oxide layer 14 and the surrounding-nitride layer 15.

In addition, the gate oxide layer 17 is formed on the sidewall 1211 of the trench 121, the top portion of the surrounding-nitride layer 15 and the concave surfaces of the remnant-oxide layer 16. The gate 18 is contained by the gate oxide layer 17. As shown in FIG. 13, the gate 18 is separated from the electrode subsequently by the gate oxide layer 17, the surrounding-nitride layer 15 and the surrounding-oxide layer 14.

The P-body region 19 and the source region 20 are formed at the top portion of the epitaxial layer 12 by separating the gate 18 by the gate oxide layer 17. The interlayer dielectric 21 is to cover the source region 20 and the gate 18. The source electrode 22 is further to cover the P-body region 19 and the interlayer dielectric 21 and to contact the source region 20.

Figure 14:
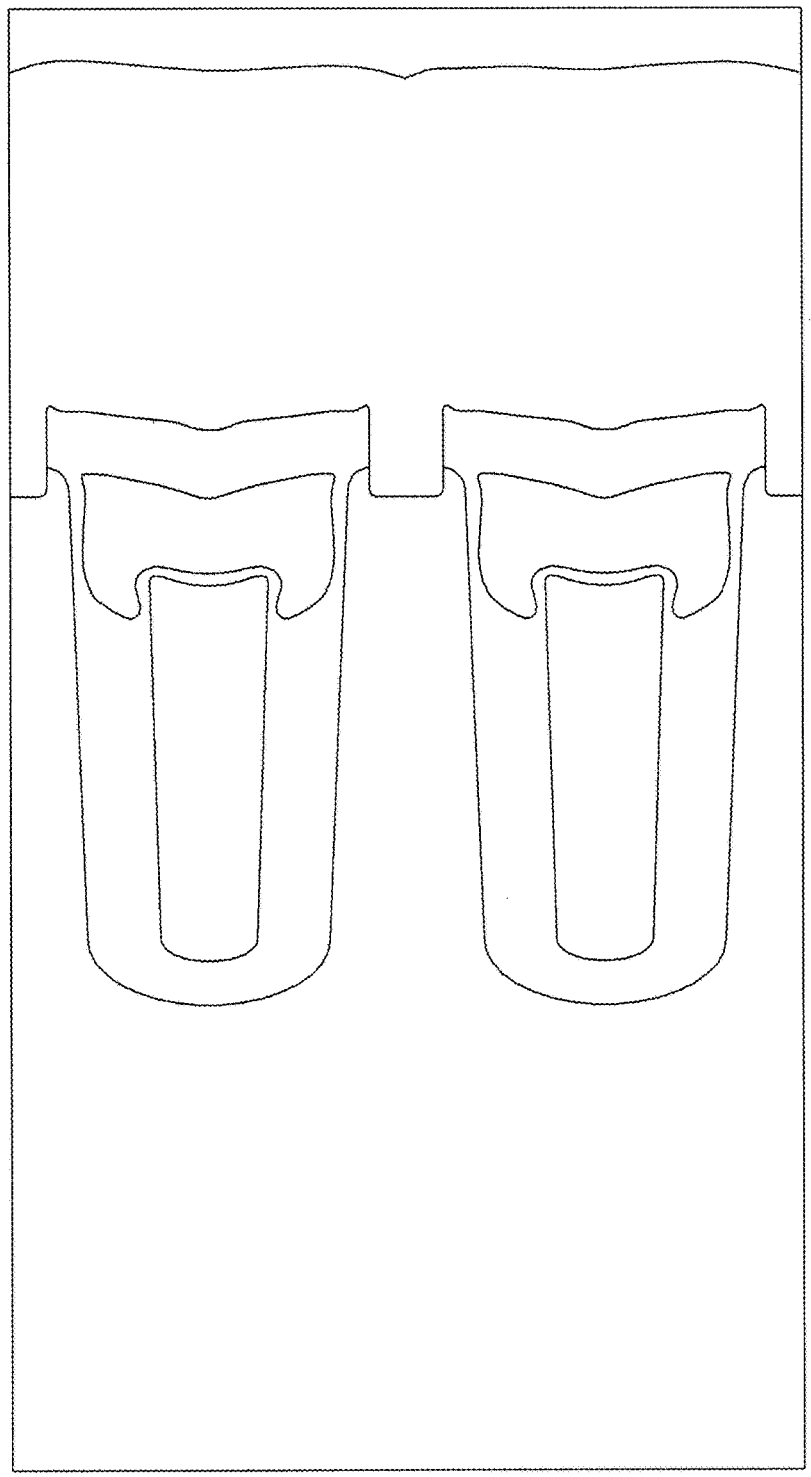
FIG. 14 is a schematic cross-sectional view of an integral structure consisted of two conventional field effect transistors.
Figure 15:
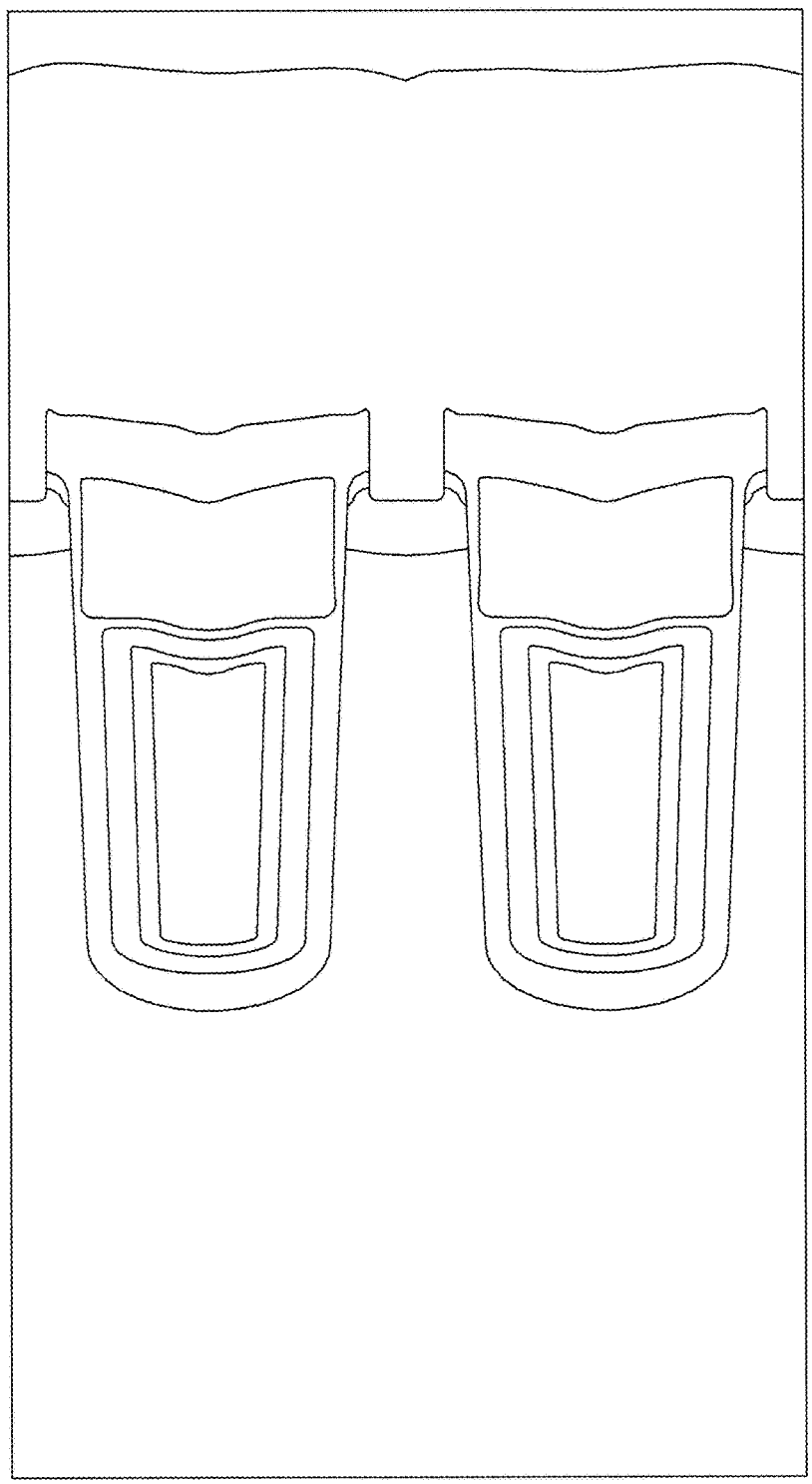
FIG. 15 is a schematic cross-sectional view of an integral structure consisted of two field effect transistors of FIG. 13.

Refer now to FIG. 14 and FIG. 15; where FIG. 14 is a schematic cross-sectional view of an integral structure consisted of two conventional field effect transistors, and FIG. 15 is a schematic cross-sectional view of an integral structure consisted of two field effect transistors of FIG. 13.

DC simulations are performed individually upon the structures of FIG. 14 and FIG. 15 by relevant software, and the results therefrom are listed in the following table.

|  | Breakdown voltage (V) | Critical voltage (V) | On-state resistance (mΩ-mm²) | Figure of merit (FOM) |
| --- | --- | --- | --- | --- |
| Structure of FIG. 14 | ≈125 | ≈3 | 50.39 | 5946 |
| Structure of FIG. 15 | ≈115 | ≈3.7 | 54.5 | 5396 |

In the table, it is noted that the FOM of the structure of FIG. 15 (the instant invention) is lower than that of the structure of FIG. 14 (the prior art). Hence, by applying the field effect transistor of the present invention, the FOM thereof can be effectively reduced. In addition, from comparison of FIG. 15 and FIG. 14, it is found that the aforesaid shortcoming caused by the dimple structure of FIG. 14 can be substantially improved by the field effect transistor having an electrode coated sequentially by an oxide layer and a nitride layer 1 shown in FIG. 15.

Figure 16:
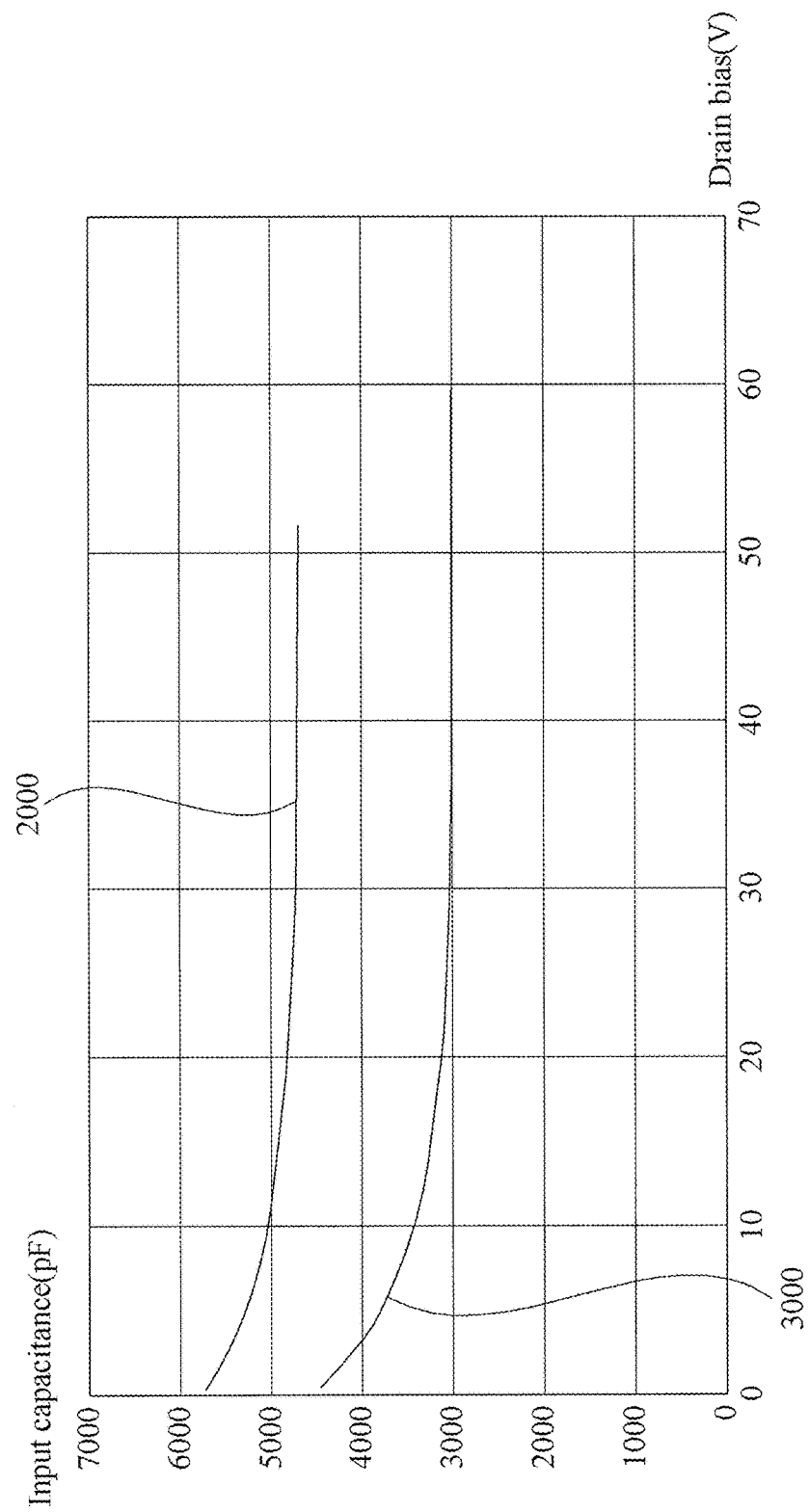
FIG. 16 is a schematic waveform plot showing input capacitance of the field effect transistors of the present invention and the prior art.

Referring now to FIG. 16, a schematic waveform plot showing input capacitance of the field effect transistors of the present invention and the prior art is present. Results in FIG. 16 are obtained by relevant AC simulations upon the structures of FIG. 14 and FIG. 15. In FIG. 16, the waveform 2000 stands for the waveform of the structure of FIG. 14, while the waveform 3000 stands for the waveform of the structure of FIG. 15. By observing the waveforms 2000 and 3000, with the same drain bias $V_D$=50V to compare the input capacitance of the structures of FIG. 14 and FIG. 15, it is found that the input capacitance of the structure of FIG. 15 is significantly smaller than that of the structure of FIG. 14.

| $V_D$ = 50 V | Input capacitance (pF) | Comparative percentage |
| --- | --- | --- |
| Structure of FIG. 14 | 4701.22 | N/A |
| Structure of FIG. 15 | 3046.956 | −35.19% |

Figure 17:
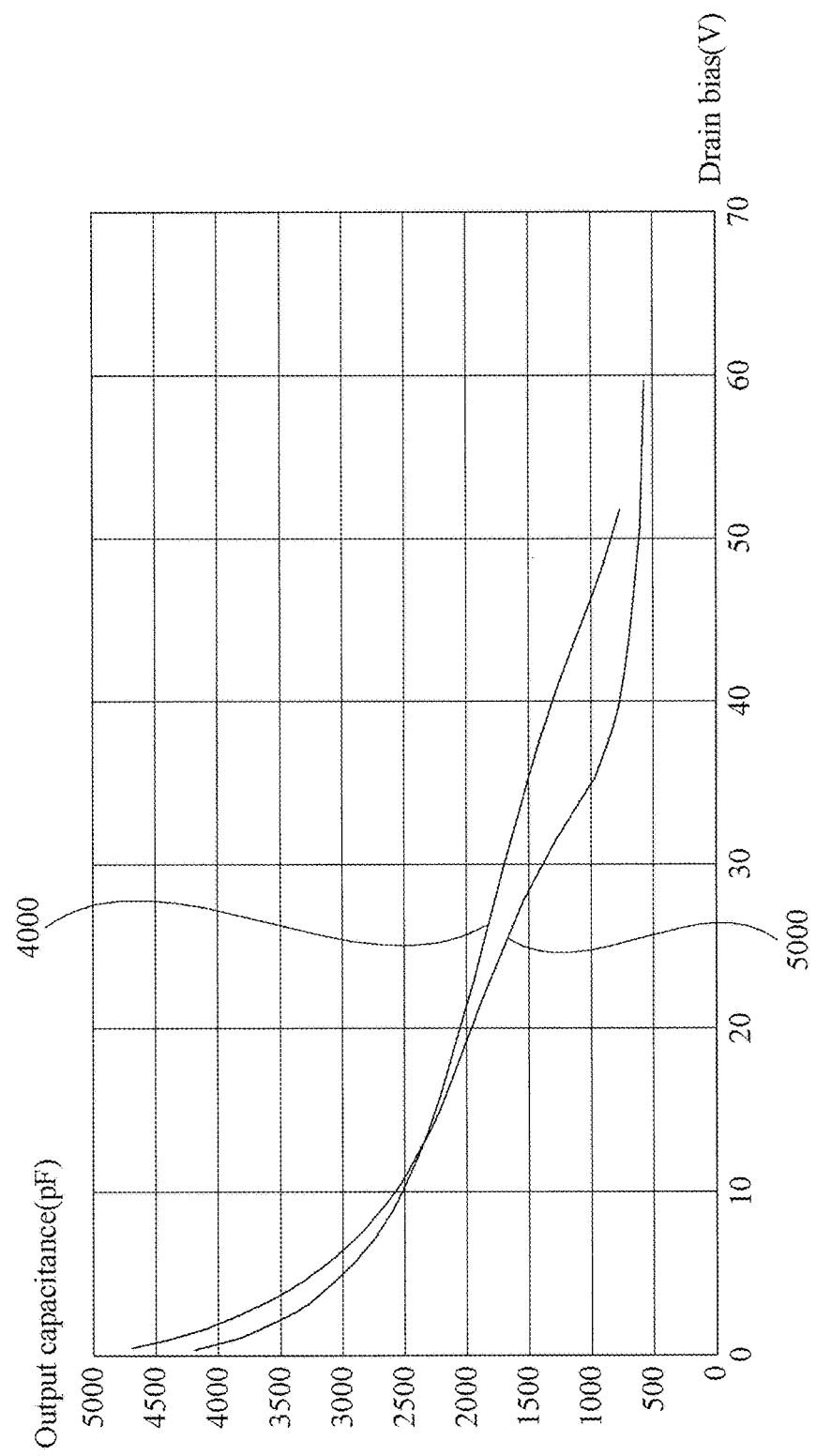
FIG. 17 is a schematic waveform plot showing output capacitance of the field effect transistors of the present invention and the prior art.

Referring now to FIG. 17, a schematic waveform plot showing output capacitance ($C_{OSS}$) of the field effect transistors of the present invention and the prior art is present. Results in FIG. 17 are obtained by relevant AC simulations upon the structures of FIG. 14 and FIG. 15. In FIG. 17, the waveform 4000 stands for the waveform of the structure of FIG. 14, while the waveform 5000 stands for the waveform of the structure of FIG. 15. By observing the waveforms 4000 and 5000, with the same drain bias $V_D$=50V to compare the output capacitance of the structures of FIG. 14 and FIG. 15, it is found that the output capacitance of the structure of FIG. 15 is significantly smaller than that of the structure of FIG. 14.

| $V_D$ = 50 V | Output capacitance (pF) | Comparative percentage |
| --- | --- | --- |
| Structure of FIG. 14 | 824.3329 | N/A |
| Structure of FIG. 15 | 614.4153 | −25.47% |

Figure 18:
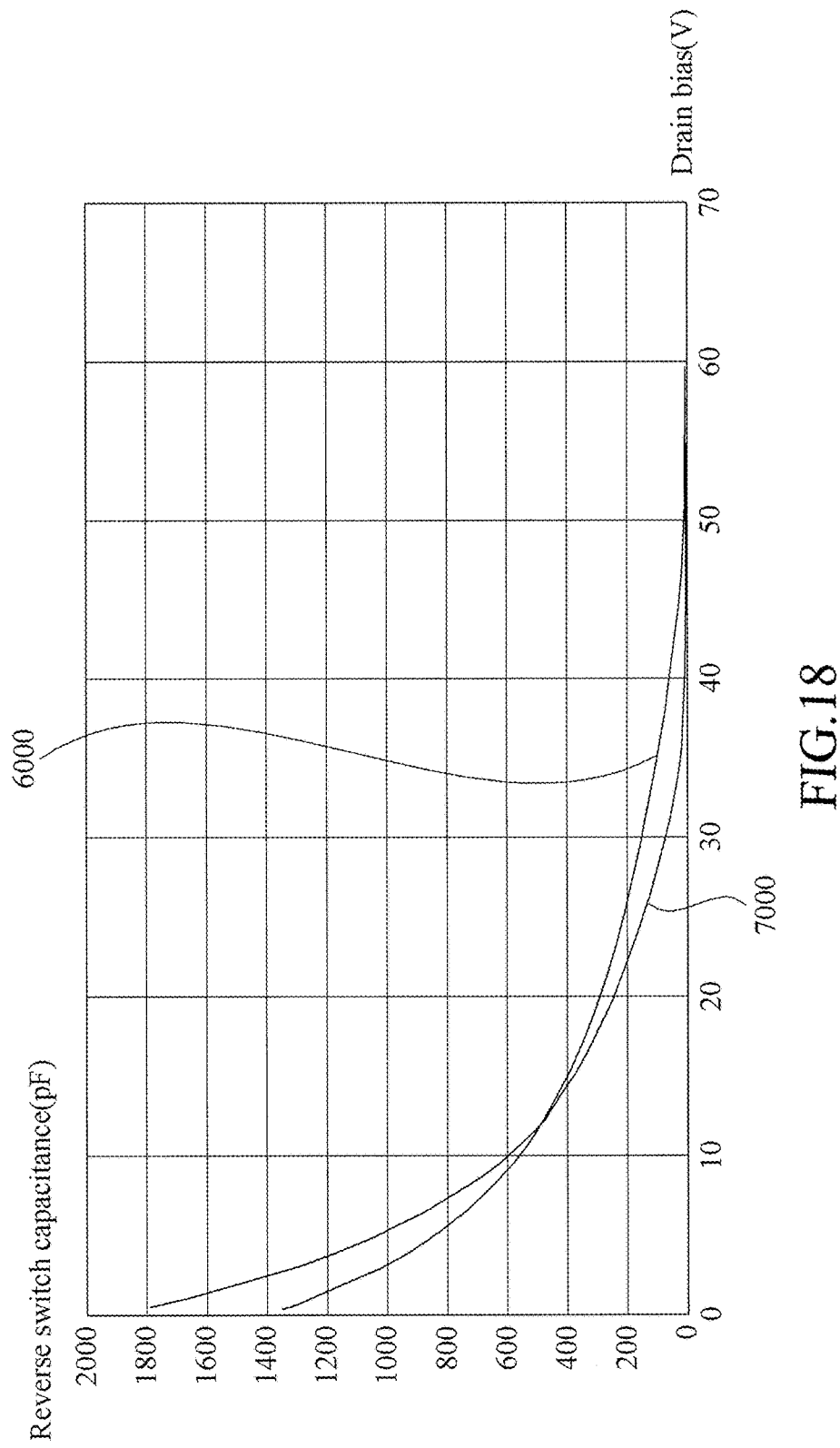
FIG. 18 is a schematic waveform plot showing reverse switch capacitance of the field effect transistors of the present invention and the prior art.

Referring now to FIG. 18, a schematic waveform plot showing reverse switch capacitance ($C_{RSS}$) of the field effect transistors of the present invention and the prior art is present. Results in FIG. 18 are obtained by relevant AC simulations upon the structures of FIG. 14 and FIG. 15. In FIG. 16, the waveform 6000 stands for the waveform of the structure of FIG. 14, while the waveform 7000 stands for the waveform of the structure of FIG. 15. By observing the waveforms 6000 and 7000, with the same drain bias $V_D$=50V to compare the reverse switch capacitance of the structures of FIG. 14 and FIG. 15, it is found that the reverse switch capacitance of the structure of FIG. 15 is significantly smaller than that of the structure of FIG. 14.

|  | Reverse switch capacitance (pF) | comparative percentage |
| --- | --- | --- |
| Structure of FIG. 14 | 17.15413 | N/A |
| Structure of FIG. 15 | 9.846057 | −42.6% |

Figure 19:
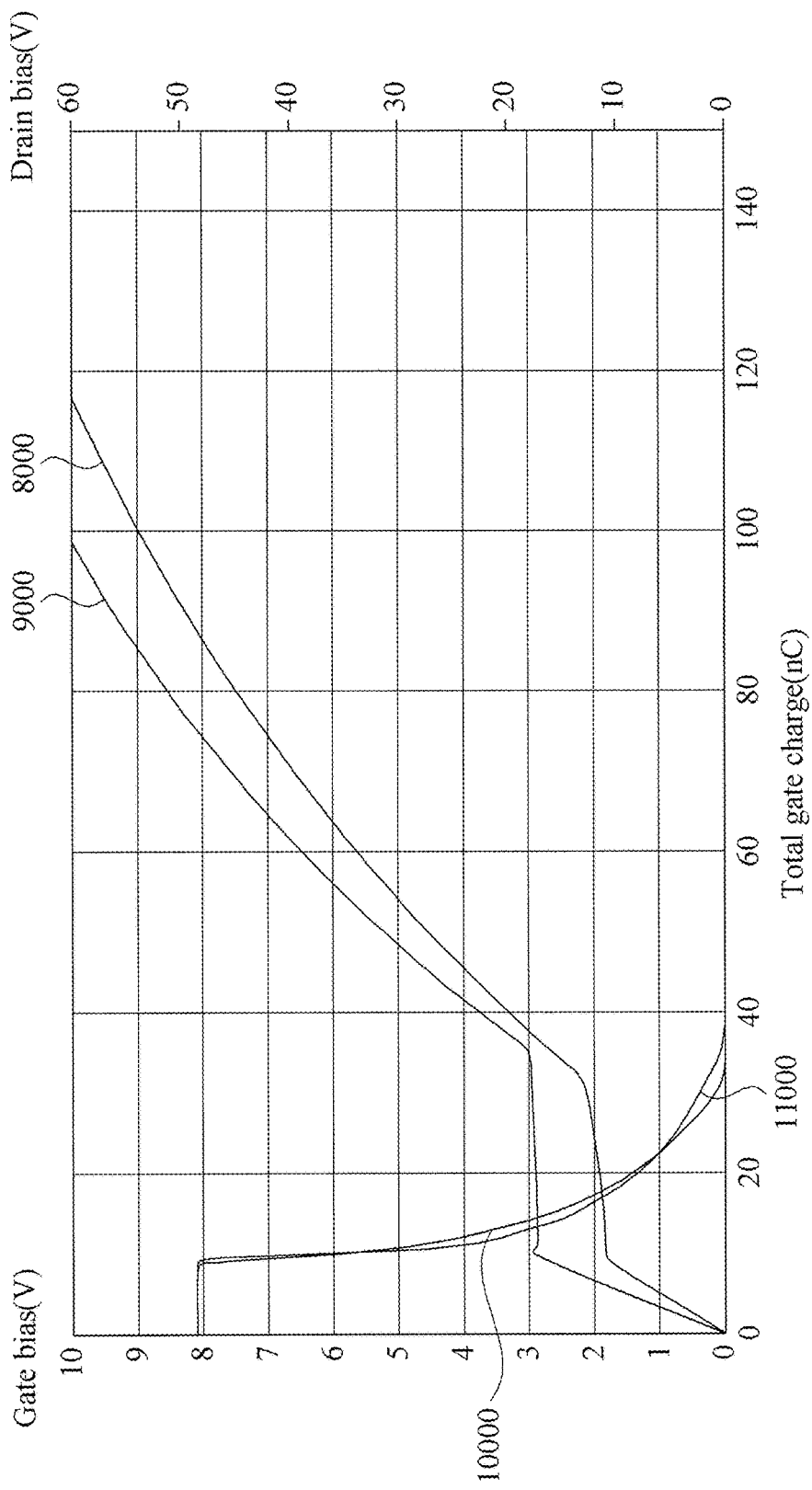
FIG. 19 is a schematic waveform plot showing the total gate charge of the field effect transistors of the present invention and the prior art.

Referring now to FIG. 19, a schematic waveform plot showing the total gate charge of the field effect transistors of the present invention and the prior art is present. Results in FIG. 19 are obtained by relevant AC simulations upon the structures of FIG. 14 and FIG. 15. In FIG. 19, the waveforms 8000 and 10000 stand for the waveforms of the structure of FIG. 14, while the waveforms 9000 and 11000 stand for the waveforms of the structure of FIG. 15. By observing the waveforms 8000, 9000, 10000 and 11000, no matter that the same gate bias $V_G$ or the same drain bias $V_D$ is applied to compare the total gate charge (Qg) of the structures of FIG. 14 and FIG. 15, it is found that the total gate charge of the structure of FIG. 15 is substantially smaller than that of the structure of FIG. 14.

| $V_G$ = 10 V | | Comparative percentage |
|---|---|---|
| | Qgs | |
| Structure of FIG. 14 | 9.1 | N/A |
| Structure of FIG. 15 | 9.6 | 5.49% |
| | Qgd | |
| Structure of FIG. 14 | 22.4 | N/A |
| Structure of FIG. 15 | 25.4 | 13.39% |
| | Qg | |
| Structure of FIG. 14 | 118 | N/A |
| Structure of FIG. 15 | 99 | −16.1% |

In summary, by providing the field effect transistor having an electrode coated sequentially by an oxide layer and a nitride layer and the method for manufacturing the same in accordance with the present invention, since a complete ONO (Oxide nitride oxide) structure is formed and the gate oxide layer fills the concave surface, thus the conventional shortcomings in the low total gate charge and the low FOM caused by the dimple structure can be effectively resolved.

While the present invention has been particularly shown and described with reference to a preferred embodiment, it will be understood by those skilled in the art that various changes in form and detail may be without departing from the spirit and scope of the present invention.

What is claimed is:

1. A method for manufacturing a field effect transistor having an electrode coated sequentially by an oxide layer and a nitride layer, comprising the steps of:
    (a) providing a semiconductor substrate, and then forming an epitaxial layer over the semiconductor substrate;
    (b) etching the epitaxial layer to form a trench extending in a vertical direction, the trench having a sidewall and a bottom;
    (c) forming a first oxide layer over the epitaxial layer, the sidewall and the bottom, and then forming a first nitride layer over the first oxide layer;
    (d) forming a second oxide layer over the first nitride layer, and then forming a first poly silicon layer over the second oxide layer;
    (e) removing part of the first poly silicon layer by etching, and defining the rest of the first poly silicon layer inside the trench as an electrode;
    (f) forming a third oxide layer over the electrode and the second oxide layer;
    (g) removing part of the second oxide layer and the third oxide layer by etching, and defining the rest of the second oxide layer and the third oxide layer as a surrounding-oxide layer completely coating the electrode;
    (h) forming a second nitride layer over the surrounding-oxide layer and the first nitride layer;
    (i) removing part of the first nitride layer and the second nitride layer by etching, and defining the rest of the first nitride layer and the second nitride layer inside the trench as a surrounding-nitride layer completely coating the surrounding-oxide layer;
    (j) removing part of the first oxide layer by etching, and defining the rest of the first oxide layer inside the trench as a remnant-oxide layer;
    (k) forming a gate oxide layer over the sidewall, the surrounding-nitride layer and the remnant-oxide layer, and forming a gate on the gate oxide layer, the gate being separated from the electrode sequentially by the gate oxide layer, the surrounding-nitride layer and the surrounding-oxide layer;
    (l) forming sequentially a P-body region and a source region at the epitaxial layer by being close to the gate;
    (m) forming an interlayer dielectric to cover the source region and the gate; and
    (n) forming a source electrode to cover the P-body region and the interlayer dielectric and to contact the source region, such that the field effect transistor having the electrode coated sequentially by the oxide layer and the nitride layer is produced.

2. The method for manufacturing a field effect transistor having an electrode coated sequentially by an oxide layer and a nitride layer of claim 1, wherein, in the step (c), the first oxide layer includes a first oxide and a second oxide, the first oxide being formed over the epitaxial layer, the sidewall and the bottom, the second oxide being formed over the first oxide.

3. The method for manufacturing a field effect transistor having an electrode coated sequentially by an oxide layer and a nitride layer of claim 1, wherein, in the step (j), the remnant-oxide layer has a concave surface connecting the sidewall and an upper portion of the surrounding-nitride layer.

4. The method for manufacturing a field effect transistor having an electrode coated sequentially by an oxide layer and a nitride layer of claim 3, wherein, in the step (k), the gate oxide layer fills the concave surface.

5. The method for manufacturing a field effect transistor having an electrode coated sequentially by an oxide layer and a nitride layer of claim 1, in the step (k), further including a step (k0) of forming a second poly silicon layer over the gate oxide layer, removing part of the second poly silicon layer by etching, and defining the rest of the second poly silicon layer inside the trench as the gate.

* * * * *